(12) United States Patent
Aderhold

(10) Patent No.: US 10,330,535 B2
(45) Date of Patent: *Jun. 25, 2019

(54) PYROMETER BACKGROUND ELIMINATION

(71) Applicant: Applied Materials, Inc., Santa Clara, CA (US)

(72) Inventor: Wolfgang R. Aderhold, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 131 days.

This patent is subject to a terminal disclaimer.

(21) Appl. No.: 15/668,965

(22) Filed: Aug. 4, 2017

(65) Prior Publication Data

US 2017/0328775 A1 Nov. 16, 2017

Related U.S. Application Data

(63) Continuation of application No. 14/522,858, filed on Oct. 24, 2014, now Pat. No. 9,759,615.

(Continued)

(51) Int. Cl.
*H01L 21/26* (2006.01)
*G01J 5/06* (2006.01)
(Continued)

(52) U.S. Cl.
CPC .............. *G01J 5/06* (2013.01); *G01J 5/0007* (2013.01); *G01J 2005/0085* (2013.01); *G01J 2005/065* (2013.01); *H01L 21/67115* (2013.01)

(58) Field of Classification Search
CPC ........................................................ G01J 5/06
See application file for complete search history.

(56) References Cited

U.S. PATENT DOCUMENTS 6,168,668 B1   1/2001   Yudovsky
6,521,292 B1 *  2/2003   Yudovsky ............. C23C 16/455
                                                   118/500

(Continued)

FOREIGN PATENT DOCUMENTS

CN        101999161 A       3/2011
JP       2001313269 A      11/2001

(Continued)

OTHER PUBLICATIONS

International Search Report and Written Opinion for International Application No. PCT/US2014/062016 dated Jan. 28, 2015.

(Continued)

*Primary Examiner* — Clayton E. LaBalle
*Assistant Examiner* — Leon W Rhodes, Jr.
(74) *Attorney, Agent, or Firm* — Patterson + Sheridan LLP

(57) ABSTRACT

Embodiments disclosed herein provide an RTP system for processing a substrate. An RTP chamber has a radiation source configured to deliver radiation to a substrate disposed within a processing volume. One or more pyrometers are coupled to the chamber body opposite the radiation source. In one example, the radiation source is disposed below the substrate and the pyrometers are disposed above the substrate. In another example, the radiation source is disposed above the substrate and the pyrometers are disposed below the substrate. The substrate may be supported in varying manners configured to reduce physical contact between the substrate support and the substrate. An edge ring and shield are disposed within the processing volume and are configured to reduce or eliminate background radiation from interfering with the pyrometers. Additionally, an absorbing surface may be coupled to the chamber body to further reduce background radiation interference.

20 Claims, 9 Drawing Sheets

Related U.S. Application Data

(60) Provisional application No. 61/903,079, filed on Nov. 12, 2013.

(51) Int. Cl.
　　*G01J 5/00*　　　　(2006.01)
　　*H01L 21/67*　　　(2006.01)

(56) References Cited

U.S. PATENT DOCUMENTS

| | | |
|---|---|---|
| 6,868,302 B2 * | 3/2005 | Kobayashi ............ H01L 21/324 |
| | | 257/E21.324 |
| 7,115,837 B2 | 10/2006 | Timans et al. |
| 7,358,462 B2 | 4/2008 | Timans |
| 7,414,224 B2 | 8/2008 | Aderhold et al. |
| 7,985,945 B2 | 7/2011 | Koelmel et al. |
| 8,434,937 B2 | 5/2013 | Koelmel et al. |
| 8,506,161 B2 | 8/2013 | Haw |
| 2008/0242117 A1 * | 10/2008 | Ramanarayanan ... H01L 21/324 |
| | | 438/795 |
| 2009/0274454 A1 | 11/2009 | Aderhold et al. |
| 2009/0289053 A1 | 11/2009 | Ranish et al. |
| 2011/0123178 A1 | 5/2011 | Aderhold et al. |
| 2012/0208377 A1 | 8/2012 | Timans |
| 2012/0213500 A1 | 8/2012 | Koelmel et al. |
| 2013/0183834 A1 | 7/2013 | Rogers et al. |

FOREIGN PATENT DOCUMENTS

| | | |
|---|---|---|
| JP | 2002100583 A | 4/2002 |
| JP | 2002-299275 A | 10/2002 |
| JP | 2002292275 A | 10/2002 |
| JP | 2005012073 A | 1/2005 |
| JP | 2006237516 A | 9/2006 |
| JP | 2007005399 A | 1/2007 |
| KR | 2002-0096261 A | 12/2002 |
| TW | 201011839 A | 3/2010 |
| TW | 201023270 A | 6/2010 |

OTHER PUBLICATIONS

Office Action dated May 3, 2018 for Chinese Application No. 201480061109.4.
Search Report dated Apr. 24, 2018 for Chinese Application No. 201480061109.4.
Office Action for Taiwan Application No. 103137053 dated Apr. 26, 2018.
Search Report for Taiwan Application No. 103137053 dated Apr. 25, 2018.
Office Action for Chinese Application No. 201480061109.4 dated Dec. 12, 2018.

* cited by examiner

PYROMETER BACKGROUND ELIMINATION

CROSS-REFERENCE TO RELATED APPLICATIONS

This application is a continuation of U.S. patent application Ser. No. 14/522,858, filed Oct. 24, 2014, which claims benefit of U.S. Provisional Patent Application No. 61/903,079, filed Nov. 12, 2013, both of which are hereby incorporated by reference in their entirety.

BACKGROUND

Field

Embodiments described herein generally relate to thermal processing of substrates. More specifically, embodiments provided herein relate to an apparatus for pyrometer background elimination.

Description of the Related Art

A number of applications involve thermal processing of semiconductor and other materials, which require precise measurement and control of the temperature of the materials being thermally processed. For instance, processing of a semiconductor substrate requires precise measurement and control of the temperature over a wide range of temperatures. One example of such processing is rapid thermal processing (RTP), which is used for a number of fabrication processes, including rapid thermal annealing (RTA), rapid thermal cleaning (RTC), rapid thermal chemical vapor deposition (RTCVD), rapid thermal oxidation (RTO), and rapid thermal nitridation (RTN).

Temperature uniformity across the surface of the substrate is important for thermal processing. For example, it is desirable to have temperature variations of less than about 3° across the surface of the substrate to improve thermal processing results. Conventional substrate supports that support a substrate in RTP processes generally contact the substrate around the circumference of the substrate. The contact between the substrate support and the substrate can create temperature non-uniformities near the edge of the substrate. To overcome the temperature non-uniformities associated with the physical contact between the substrate support and the substrate, various other methods which minimize contact between the support and the substrate may be utilized. However, these methods allow for excess background radiation to propagate beyond the substrate. The excess radiation may interfere with temperature metrology devices and skew temperature measurements of the substrate.

Thus, what is needed in the art are apparatuses for supporting a substrate with minimal physical contact and for reducing or eliminating background radiation to improve temperature measurement of an RTP system.

SUMMARY

In one embodiment, an apparatus for reducing background radiation is provided. The apparatus includes a chamber body defining a processing volume and a radiation source may be coupled to the chamber body. One or more pyrometers may be coupled to the chamber body opposite the radiation source. A support ring may be disposed within the processing volume and an edge ring may be disposed on the support ring. A radiation shield may be disposed above the edge ring and an inner diameter of the radiation shield may extend radially inward over a substrate support member of the edge ring.

In another embodiment, an apparatus for reducing background radiation is provided. The apparatus includes a chamber body defining a processing volume and a radiation source may be coupled to the chamber body. A window may separate the processing volume from the radiation source and the radiation source may be coupled to the chamber body below the window. One or more pyrometers may be coupled to the chamber body opposite the radiation source. A support ring may be disposed within the processing volume and an edge ring may be disposed on the support ring. A radiation shield may be disposed above the edge ring and an inner diameter of the radiation shield may extend radially inward over a substrate support member of the edge ring. An absorptive coating may be disposed on the chamber body adjacent a region where the pyrometers are coupled to the chamber body and the absorptive coating comprises a dielectric material selected to absorb or reflect radiation within a desired wavelength.

In yet another embodiment, an apparatus for reducing background radiation is provided. The apparatus comprises a chamber body defining a processing volume and a radiation source coupled to the chamber body. A window may separate the processing volume from the radiation source and the radiation source may be coupled to the chamber body above the window. One or more pyrometers may be coupled to the chamber body opposite the radiation source. A support ring may be disposed within the processing volume and an edge ring may be disposed on the support ring. An absorptive coating may be disposed on a bottom of the chamber body adjacent a region where the pyrometers are coupled to the chamber body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein provide an RTP system for processing a substrate. An RTP chamber has a radiation source configured to deliver radiation to a substrate disposed within a processing volume. One or more pyrometers are coupled to the chamber body opposite the radiation source. In one example, the radiation source is disposed below the substrate and the pyrometers are disposed above the substrate. In another example, the radiation source is disposed above the substrate and the pyrometers are disposed below the substrate. The substrate may be supported in varying manners configured to reduce physical contact between the substrate support and the substrate. An edge ring and shield are disposed within the processing volume and are configured to reduce or eliminate background radiation from interfering with the pyrometers. Additionally, an absorbing surface may be coupled to the chamber body to further reduce background radiation interference.

Figure 1:
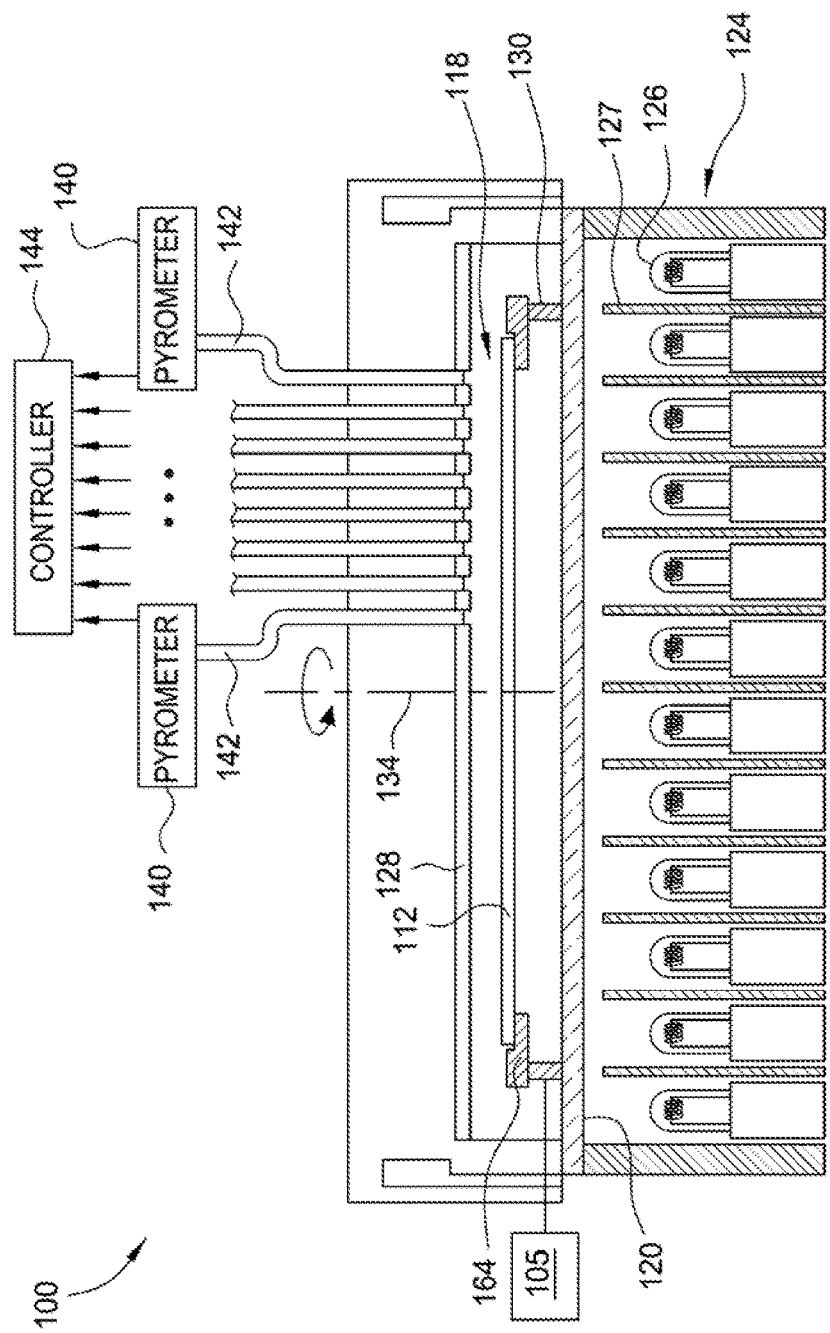
FIG. 1 schematically illustrates a thermal processing chamber.

FIG. 1 schematically illustrates a processing chamber, such as the VULCAN RTP chamber available from Applied Materials, Inc. of Santa Clara, Calif. A heating apparatus 124 is coupled to the chamber 100 below a window 120 and is configured to heat a substrate 112 during thermal processing. The heating apparatus comprises a plurality of lamps 126, which may be separated by reflectors 127. The lamps 126 are configured to rapidly heat the substrate 112 to temperatures between about 800° C. and about 1200° C. or greater. The reflectors 127 comprise an apparatus configured to concentrate radiation towards to the substrate 112. For example, the reflectors 127 may form a cavity within which the lamp 126 is disposed.

The window 120, which comprises a transparent material such as quartz, separates the heating apparatus 124 from the processing region 118 of the chamber 100. The substrate 112 to be thermally processed is supported on its periphery by an edge ring 164. The edge ring 164 is supported by and coupled to a support ring 130. The edge ring 164 is formed from a material, such as silicon carbide or the like, capable of withstanding the elevated temperatures associated with thermal processing. Although not shown, lift pins extend through the heating apparatus 124 and the window 120 to lift the substrate 112 off of the edge ring 164 during transfer of the substrate 112 into and out of the chamber 100. During processing, the lift pins are retracted below the edge ring 164 out of contact with the substrate 112.

A magnetic levitation system 105 is also provided. The magnetic levitation system is configured to rotate the support ring 130, edge ring 164, and substrate 112 during processing. For example, the magnetic levitation system raises the support ring 130 and edge ring 164, which is supporting the substrate 112, above the window 120 and causes the raised components to rotate around a central axis 134. In certain embodiments, the support ring 130 may be disposed radially outside the window 120.

One or more pyrometers 140 are coupled to the chamber 100 through a chamber ceiling 128. One or more radiation collecting apparatuses 142, such as light pipes, extend through the ceiling 128 and are directed toward the substrate 112 to measure a temperature of the substrate 112. The radiation collecting apparatuses 142 are coupled to the pyrometers 140, which are further coupled to a controller 144. The controller 144 receives outputs of the pyrometers 140 and accordingly controls the voltages supplied to the heating apparatus 124. The pyrometers 140 generally measure light intensity in a narrow wavelength bandwidth of about 30 or 40 nm in a range between about 700 nm to about 1000 nm. The controller 144 converts the light intensity to a temperature through the Plank distribution of the spectral distribution of light intensity radiating from a black body held at that temperature. In this manner, temperature of the substrate 112 can be monitored during thermal processing.

Figure 2:
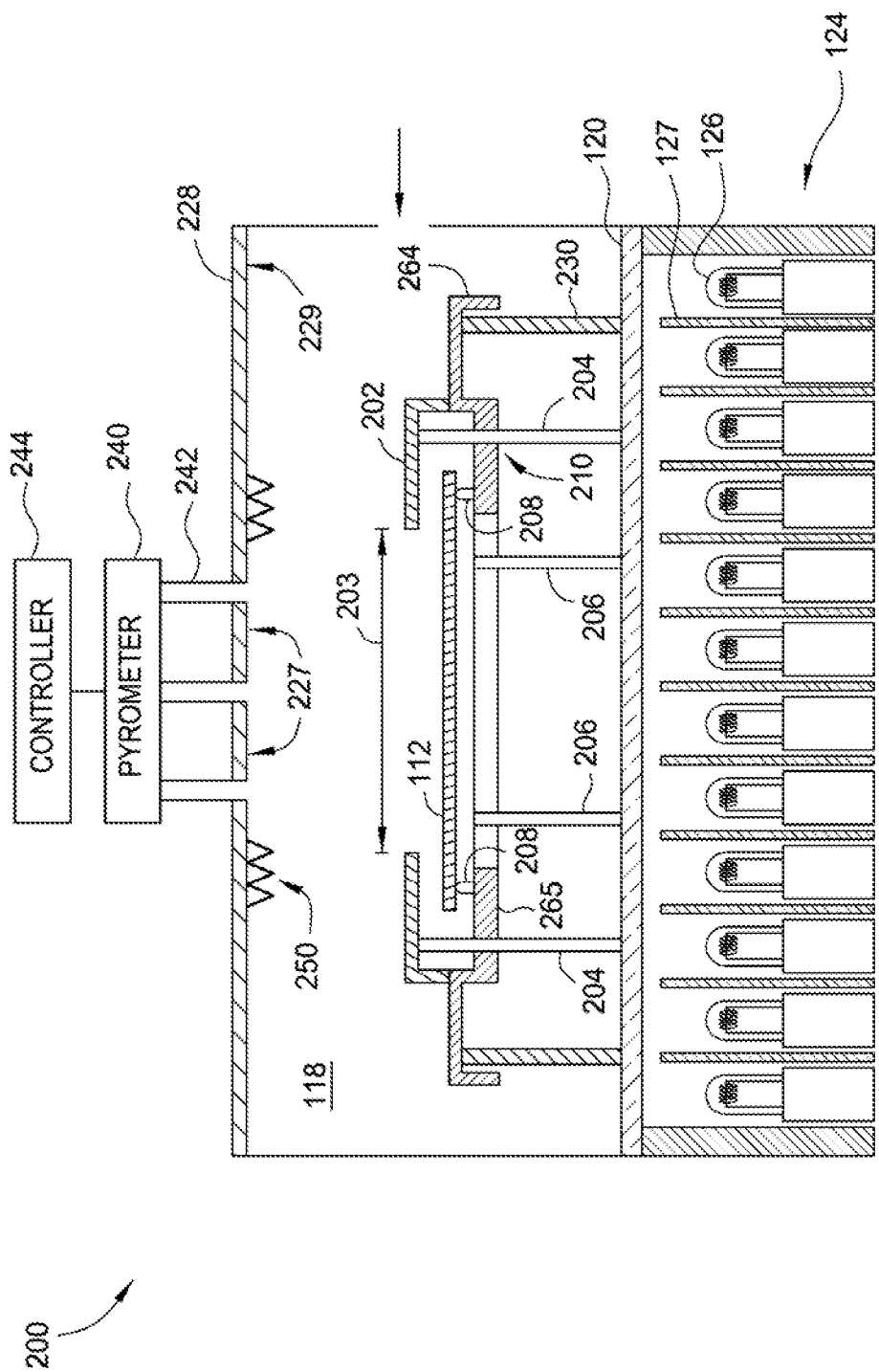
FIG. 2 illustrates a schematic, cross-sectional view of a thermal processing chamber having a radiation shield and absorbing surface disposed therein.

FIG. 2 is a schematic cross-sectional view of a thermal processing chamber 200 having a radiation shield 202 and absorbing surface 250 disposed therein according to one embodiment. The radiation shield 202 rests on a support ring 230 as described above with regard to FIG. 1 and the radiation shield 264 is configured to support the substrate 112. A plurality of protrusions 208 extend from a portion 265 of the edge ring 264 which is disposed below the substrate 112. For example, three or four protrusions 208, such as pins or posts, contact and support the substrate 112 at discrete locations on a bottom surface of the substrate 112. It is believed that the minimal physical contact between the substrate 112 and the protrusions 208 reduce thermal discontinuity across the surface of the substrate 112 when compared to traditional edge rings which support the substrate 112 around the entire circumference of the substrate 112. The protrusions 208 substantially prevent the edge ring 264 from acting as a heat sink which negatively affects temperature uniformity of the substrate 112 during thermal processing.

The edge ring 264 is made from a material which is substantially opaque and thus prevents the transmission of light through the edge ring 264. However, because the protrusions 208 separate the substrate 112 from the edge ring 264, light may propagate through the space between the substrate 112 and the edge ring 264 towards one or more pyrometers 240. This stray radiation, or background radiation, adversely affects the temperature measurement of the pyrometers 240 which are configured to measure the temperature of the substrate 112.

To prevent or reduce background radiation, the radiation shield 202 is disposed within the chamber 200. The radiation shield 202 is substantially ring-like and is made of a thermally stable opaque material, such as silicon carbide or the like. During thermal processing, the radiation shield 202 is supported by the edge ring 264 and at least a portion of the radiation shield 202 is disposed over a top surface of the substrate 112. The radiation shield 202 has an inner diameter 203 which is less than a diameter of the substrate 112. Thus, the radiation shield 202 extends over and above an outer portion of the substrate 112.

A first plurality of lift pins 204 are configured to contact the radiation shield 202 and raise the radiation shield 202 from the edge ring 264. The lift pins 204 extend through one or more voids 210 of the edge ring 164 sized to accommodate the lift pins 204. Although not shown, the lift pins 204 extend through the window 120 and the heating apparatus 124 and are coupled to an actuator, which is configured to move the lift pins 204 up and down along a vertical path. A second plurality of lift pins 206 are also provided in the chamber 200. The lift pins 206 are configured to engage the substrate 112 and support the substrate 112 during processing. The lift pins 206 are also configured to raise and lower the substrate 112 to accommodate ingress and egress of the substrate from the processing volume 118.

In operation, the first plurality of lift pins 204 engage the radiation shield 202 and raise the radiation shield above and clear of a plane occupied by the substrate 112 while the substrate 112 is being transferred into the chamber 200. The second plurality of lift pins 206 are positioned in a raised orientation to accept the substrate 112 from a robot blade (not shown). After the substrate 112 has been engaged by the lift pins 206, the robot blade is removed from the chamber 200 and the lift pins 206 retract and lower the substrate 112 into a processing position in contact with the protrusions 208. Subsequently, the lift pins 204 lower the radiation shield 202 into contact with the edge ring 264 such that the radiation shield 202 rests on the edge ring 264. The lift pins 204 then continue to retract through the voids 210 to a position below the edge ring 264 to enable the support ring 230, edge ring 264 and radiation shield 202 to be rotated by the magnetic levitation system (not shown).

A ceiling 228 of the chamber 200 has an absorbing surface 250 disposed thereon. The absorbing surface 250 is configured to absorb background radiation and prevent or reduce stray background radiation from reaching the pyrometers 240. In one embodiment, the pyrometers 240 and radiation collecting apparatuses 242 are disposed near a center region of the chamber 200. In another embodiment, the pyrometers 240 and radiation collecting apparatuses 242 are disposed within the chamber 200 in a region which is above a central region of the substrate 112. The absorbing surface 250 may be a dielectric coating comprising various materials configured to absorb radiation within a desired wavelength. In one embodiment, the absorbing surface 250 is textured or embossed. In addition to absorbing stray background radiation, the topography of the absorbing surface 250 is configured to direct background radiation away from the pyrometers 240. For example, a feature of the absorbing surface 250 may reflect stray background radiation not absorbed radially outward toward walls of the chamber 200 away from the pyrometers 240.

An interior surface 229 of the ceiling 228 radially outward of the pyrometers 240 and radiation collecting apparatuses 242 may be coated with the absorbing surface 250. However, portions 227 of the chamber ceiling 228 between the locations where the radiation collecting apparatuses 242 extend through the ceiling 228 are not coated with the absorbing surface 250 to prevent measurement errors of the substrate 112 temperature by the pyrometers 240. The absorbing surface 250 may be disposed over the entire interior surface 229 radially outside the portions 227 or may be disposed only on a portion of the interior surface 229. For example, the absorbing surface 250 may be disposed on the interior surface 229 at locations where the majority of stray background radiation contacts the ceiling 228.

It is believed that utilizing the radiation shield 202 in combination with the absorbing surface 250 may substantially reduce or eliminate stray background radiation from reaching the pyrometers. As a result, the temperature measurement of the substrate 112 by the pyrometers 240 may be increased and a more accurate temperature measurement may be achieved.

Figure 3:
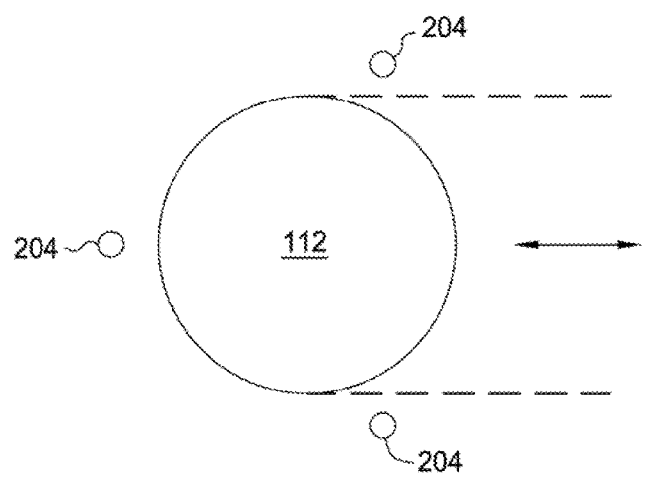
FIG. 3 is a schematic, plan view of FIG. 2 illustrating a substrate and lift pins with the radiation shield removed.

FIG. 3 is a schematic plan view of FIG. 2 illustrating the substrate 112 and lift pins 204 with the radiation shield 202 removed according to one embodiment. The lift pins 204, which are configured to engage the radiation shield 202 (not shown), are disposed in a configuration such that the substrate 112 has an unobstructed path into and out of the chamber 200. For example, the lift pins 204 are disposed beyond an outer diameter of the substrate 112 and outside of the path of travel (indicated by the dashed lines and arrow) of the substrate 112. In this manner, the radiation shield 202 is raised above the plane of travel of the substrate 112 and the substrate 112 can be positioned by the robot blade (not shown) where the substrate 112 is engaged by the lift pins 206 (not shown).

Figure 4A:
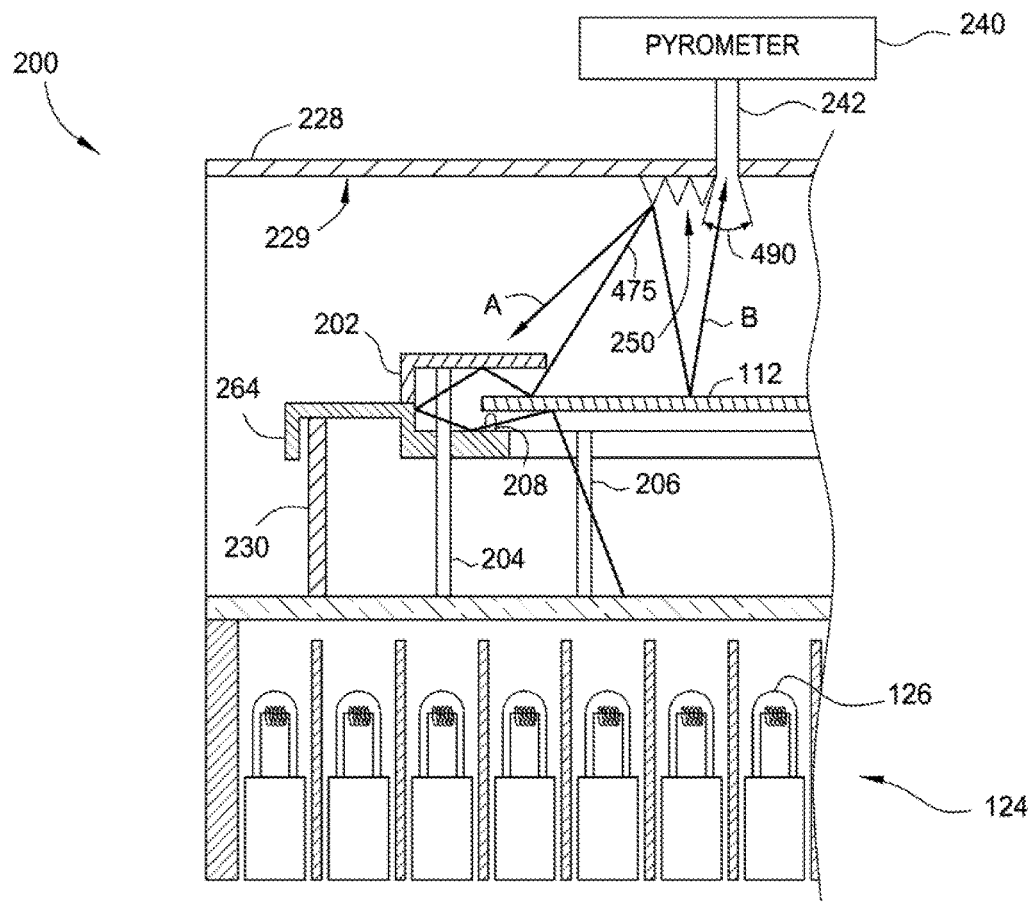
FIG. 4A is a partial, schematic cross-sectional view of the thermal processing chamber illustrating background radiation propagation paths.

FIG. 4A is a partial schematic cross-sectional view of the thermal processing chamber 100 of FIG. 2 according to one embodiment. Stray background radiation from the heating apparatus 124 propagating around the edge of the substrate 112 and toward the pyrometers 240 may propagate along various propagation paths 475. As illustrated, the propagation paths 475 may reflect from the backside of the substrate 112, the edge ring 264, the radiation shield 202, and the absorbing surface 250. Thus, the background radiation propagation paths 475 are altered by the presence and location of the radiation shield 202 and the absorbing surface 250.

For example, radiation traveling along the propagation path A may be absorbed by the absorbing surface 250 or reflected away from the pyrometers 240. Any radiation not absorbed or reflected away from the pyrometers 240 by the absorbing surface 250 travels along propagation path B. Along this path, the radiation is directed back towards a top surface of the substrate 112 and may then reflect upward to the pyrometers 240. Assuming the pyrometers 140 incorporate an optical system to reduce the field of view and the minimal view angle 490 of the pyrometers 240 to the substrate 112 is less than between about 25° and about 50°, such as less than about 30°, stray background radiation measured by the pyrometers 240 may be substantially reduced.

Figure 4B:
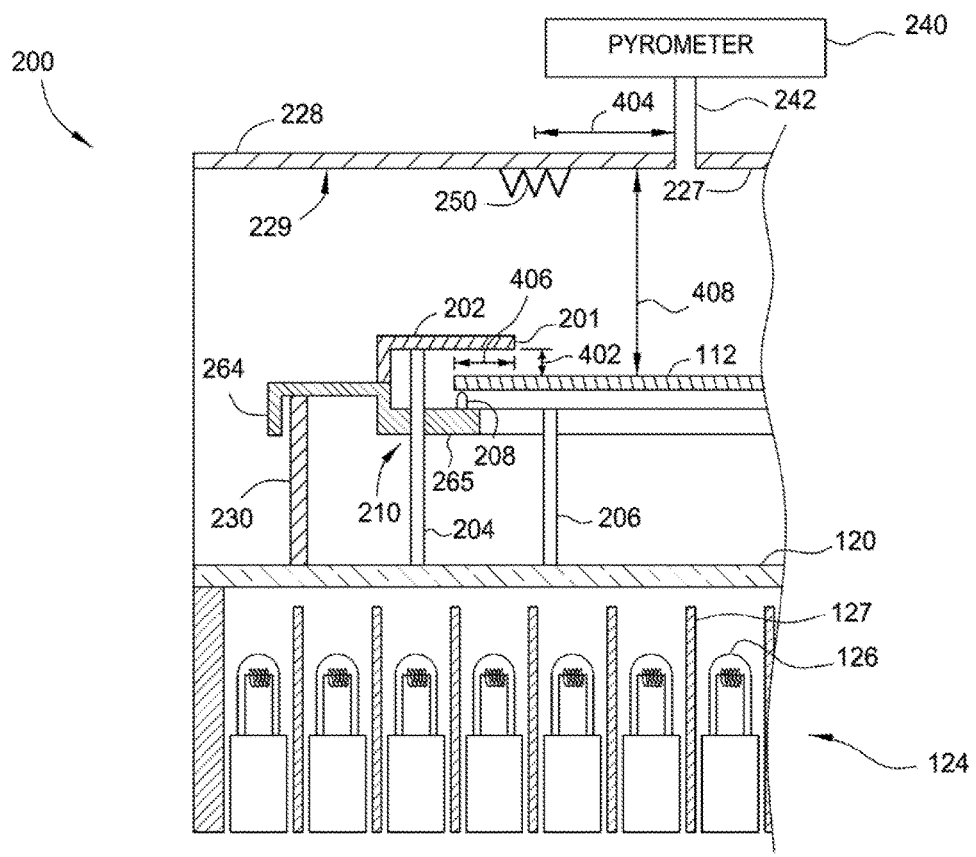
FIG. 4B illustrates a partial, schematic cross-sectional view of the thermal processing chamber of FIG. 2.

FIG. 4B is a partial schematic cross-sectional view of the thermal processing chamber 100 of FIG. 2 according to one embodiment. As previously discussed, the background radiation propagation paths are altered by the radiation shield 202 and the absorbing surface 250 to reduce the incidence of background radiation from being detected by the pyrometers 240. The relationships between the various components of the chamber 200 are generally responsible for determining the propagation paths of the background radiation.

In one embodiment, the radiation shield 202 extends laterally inward over an edge of the substrate 112 a first distance 406. A second distance 404, measured from an inner surface 201 of the radiation shield 202 to a location on the ceiling 228 where the radiation collecting apparatus 242 is disposed, is greater than the first distance 406. The absorbing surface 250 may be disposed over a portion of or over the entire distance 404 on the interior surface 229 of the ceiling 228. In another embodiment, the radiation shield 202 is disposed a third distance 402 above the substrate 112. A fourth distance 408, measured from the interior surface 229 of the ceiling 228 to the substrate 112 in a processing position, is greater than the third distance 402. The spatial relationships between the radiation shield 202, ceiling 228, radiation collecting apparatuses 242 and pyrometers 240, and the substrate 112 provide for the reduction or elimination of stray background radiation being measured by the pyrometers 240.

Figure 5:
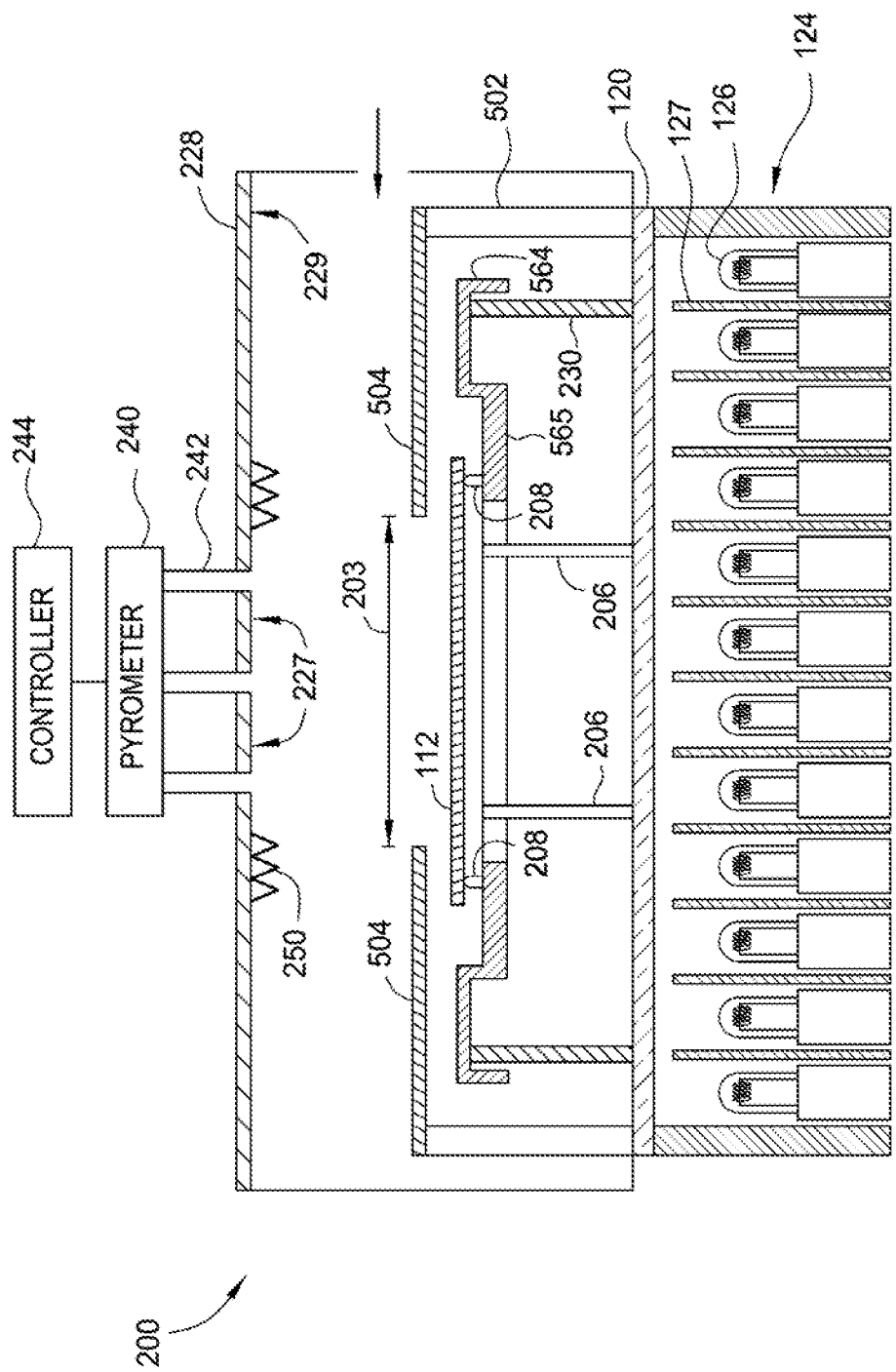
FIG. 5 illustrates a schematic, cross-sectional view of a thermal processing chamber having a radiation shield and absorbing surface disposed therein.

FIG. 5 is a schematic cross-sectional view of a thermal processing chamber 200 having a radiation shield 504 and absorbing surface 250 disposed therein according to one embodiment. The chamber 200 and components disposed therein are substantially similar to the chamber 200 and components described with regard to FIG. 2. However, the radiation shield 504 is coupled to and supported by a third plurality of lift pins 502. The lift pins 502 are configured and function similarly to the lift pins 204 described with regard to FIGS. 2 and 3, but in this embodiment, the lift pins are 502 disposed radially outward of the support ring 230 and an edge ring 564. The radiation shield 202 extends from the lift pins 502 radially inward over the substrate 112 such that the inner diameter 203 of the radiation shield 202 is the same as the inner diameter 203 described with regard to FIG. 2.

Figure 6:
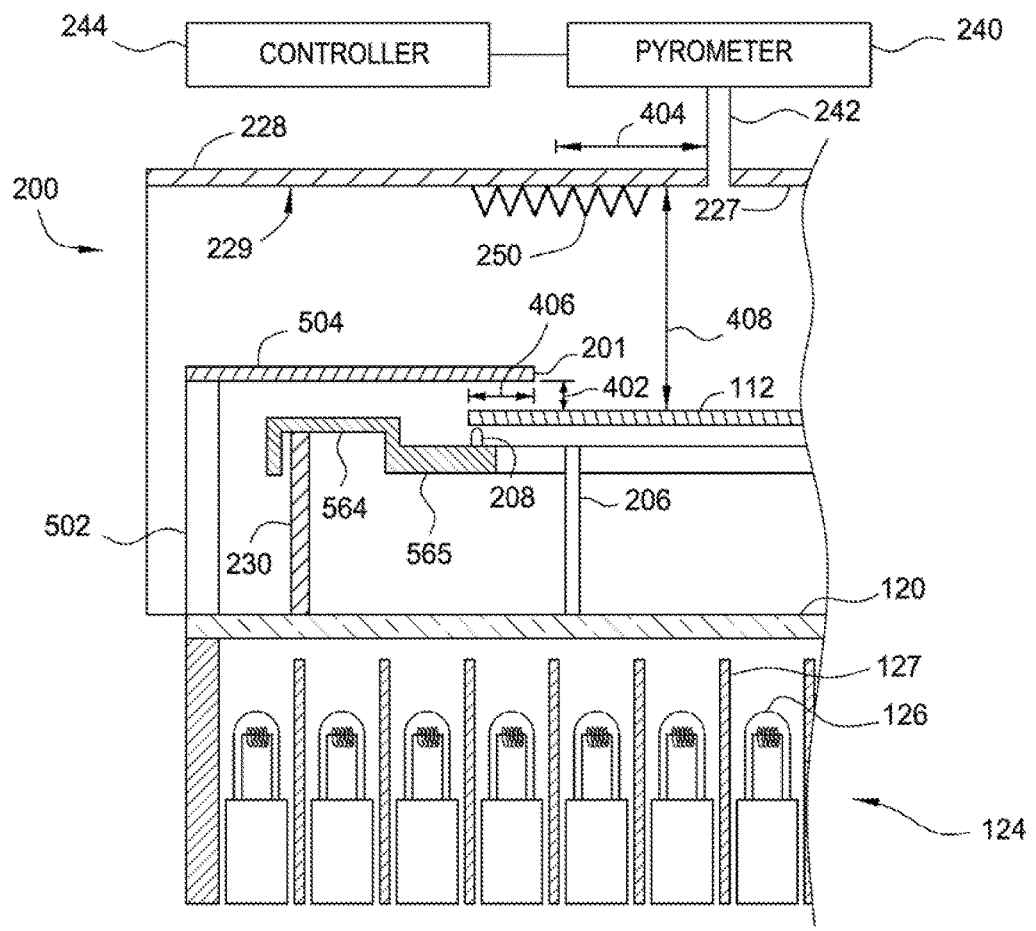
FIG. 6 illustrates a partial, schematic cross-sectional view of the thermal processing chamber of FIG. 5.

FIG. 6 is a partial schematic cross-sectional view of the thermal processing chamber 200 of FIG. 5 according to one embodiment. The distances 402, 404, 406 and 408 are similar to and described in greater detail with regard to FIG. 4B. Here, the lift pins 502 are not disposed through the edge ring 564, which reduces the complexity of manufacturing the edge ring 564 and the necessity of the lift pins 204 to extend through the edge ring 564. For example, the edge ring 564 does not have voids formed therethrough to allow for passage of lift pins, which allows the edge ring 564 to more effectively prevent the propagation of background radiation from reaching the substrate 112.

Figure 7:
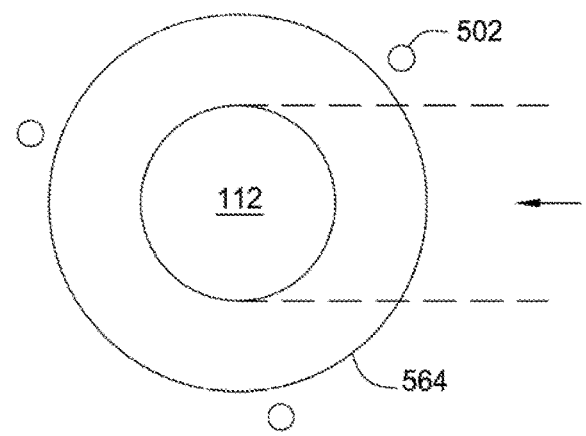
FIG. 7 is a schematic, plan view of FIG. 5 illustrating a substrate and lift pins supported by an edge ring with the radiation shield removed.

FIG. 7 is a schematic plan view of FIG. 5 illustrating the substrate 112 supported by the edge ring 564 and the lift pins 502 with the radiation shield 504 removed according to one embodiment. As illustrated, the substrate 112 is supported by the protrusions 208 (not shown) of the edge ring 564. The lift pins 502, which are configured to engage the radiation shield 504 (not shown), are disposed in a configuration such that the substrate 112 has an unobstructed path into and out of the chamber 200. For example, the lift pins 502 are disposed beyond an outer diameter of the edge ring 564 and outside of the path of travel (indicated by the dashed lines and arrow) of the substrate 112. In this manner, the radiation shield 504 is raised above the plane of travel of the substrate 112 and the substrate 112 can be positioned by the robot blade (not shown) where the substrate 112 is engaged by the lift pins 206 (not shown). In this embodiment, the lift pins 502 are disposed radially outward of the edge ring 564.

Figure 8:
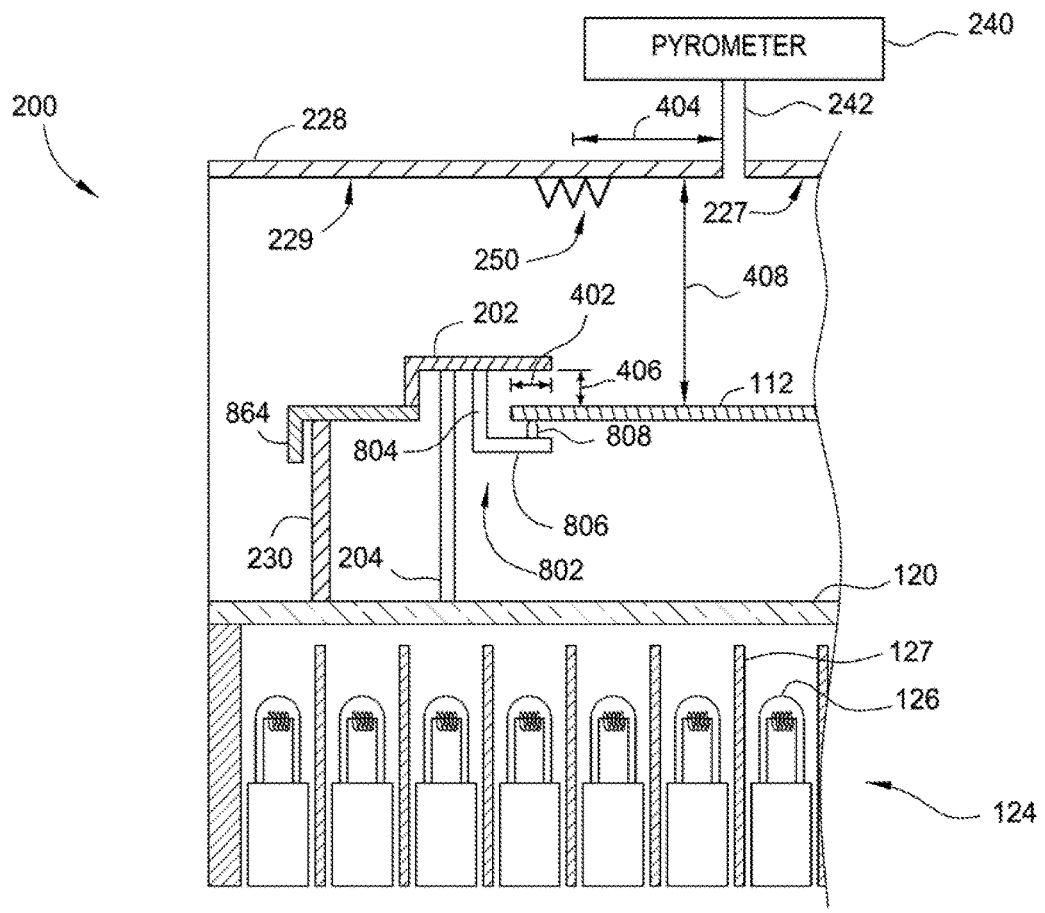
FIG. 8 illustrates a partial, schematic cross-sectional view of a thermal processing chamber.

FIG. 8 is a partial schematic cross-sectional view of the thermal processing chamber 200 according to one embodiment. In this embodiment, supports 802 of the radiation shield 202 support the substrate 112 instead of an edge ring 864. The edge ring 864, which is supported by the support ring 230, supports the radiation shield 202. The supports 802 are coupled to the radiation shield 202 and extend below the radiation shield 202. The supports 802 comprise a first member 804 which extends downward from the radiation shield 202, a second member 806 which extends substantially horizontally from the first member 804, and one or more protrusions 808. The supports 802 may be a separate apparatus coupled to the radiation shield 202 or may be an integral part of a unitary body with the radiation shield 202. The supports 802 may comprise the same material as the radiation shield 202, which is a material capable of withstanding thermal processing conditions, such as silicon carbide. In one embodiment, the supports 802 may be a transparent material, such as quartz, which may prevent shadowing of radiation from the heating apparatus 124 to prevent cold spots from forming on the substrate 112 during processing.

In one embodiment, three supports 802 may be utilized to support the substrate 112. The first member 804 extends from the radiation shield 202 from a location radially outwards from the circumference of the substrate 112 when the substrate is located in the processing position. The second member 806 extends from the first member 804 such that at least a portion of the second member 806 is disposed beneath the substrate 112 when the substrate 112 is in a processing position. The protrusions 808 extend from the second member 806 and contact the substrate 112. In this example, only the protrusions 808 contact the substrate 112 so as to minimize physical contact between the substrate 112 and the supports 802.

The first plurality of lift pins 204 function as described with regard to FIG. 2. By utilizing the supports 802, no lift pins to support the substrate 112 are necessary as the supports 802 are coupled to the radiation shield 202. It is contemplated that the spacing and relationship between the first member 804, second member 806, and protrusions 808 are configured to allow for a robot blade to place and retrieve the substrate 112 without utilizing any additional apparatuses for separating the substrate 112 from the protrusions 808. Thus, no lift pins for the substrate 112 are necessary which reduces the complexity of the chamber 200. Further, the distances 402, 404, 406 and 408 are similar to those described with regard to FIGS. 4B and 6 although the manner of supporting the substrate 112 is different.

Figure 9:
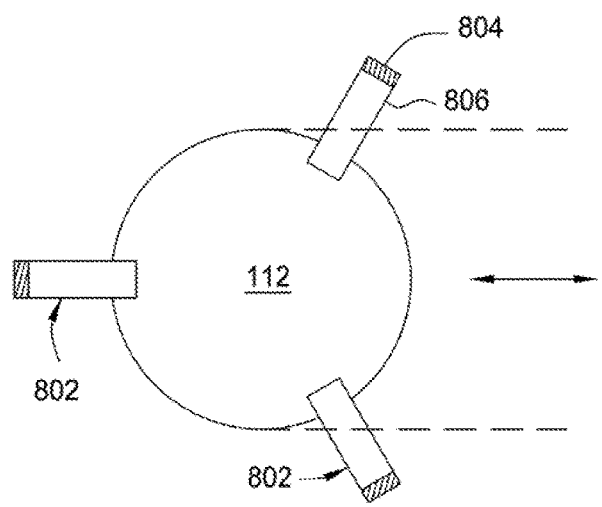
FIG. 9 is a schematic, bottom view of FIG. 8 illustrating a substrate and substrate supports with a radiation shield removed.

FIG. 9 is a schematic bottom view of the embodiments shown in FIG. 8 illustrating the substrate 112 and supports 802 with a radiation shield 202 removed according to one embodiment. As illustrated, the substrate 112 is supported by the supports 802. The first member 804 extends vertically (into the page) and the second member 806 extends horizontally from the first member 804. The first member of each support 802 is disposed beyond the path of travel (indicated by the dashed lines and arrow) of the substrate 112. The second member 806 of each of the supports 802 extends to a position inside the diameter of the substrate 112 to allow the substrate 112 to rest on the protrusions 808 (not shown) extending from the second member 806. The substrate 112 travels above the second member 806 and is lowered onto the protrusions 808 of the second member 806 by the robot blade which is then retracted along the substrate 112 travel path. Although not shown, the radiation shield 202 is spaced a distance from the second member 806 configured such that the robot blade and substrate 112 are unobstructed while positioning and moving the substrate 112.

Figure 10:
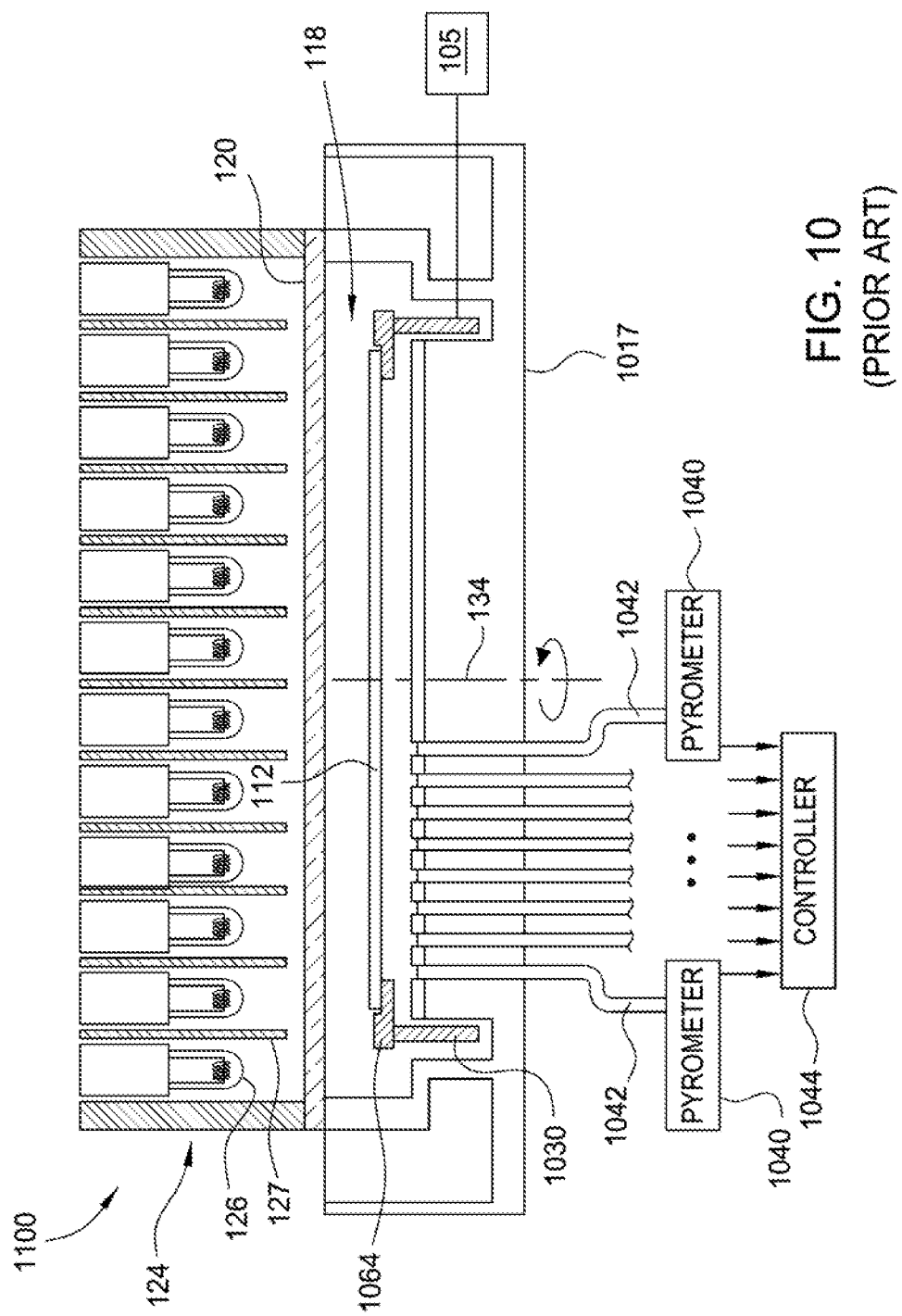
FIG. 10 schematically illustrates a thermal processing chamber.

FIG. 10 schematically illustrates a processing chamber 1100, such as the RADIANCE® RTP chamber available from Applied Materials, Inc. of Santa Clara, Calif. A heating apparatus 124 is coupled to the chamber 1100 above a window 120 and is configured to heat a substrate 112 during thermal processing. The heating apparatus 124 comprises a plurality of lamps 126, which may be separated by reflectors 127. The lamps 126 are configured to rapidly heat the substrate 112 to temperatures between about 800° C. and about 1200° C. or greater. The reflectors 127 comprise an apparatus configured to concentrate radiation towards to the substrate 112. For example, the reflectors 127 may form a cavity within which the lamp 126 is disposed.

The window 120, which comprises a transparent material such as quartz, separates the heating apparatus 124 from the processing region 118 of the chamber 1100. The substrate 112 to be thermally processed is supported on its periphery by an edge ring 1064. The edge ring 1064 is supported by and coupled to a support ring 1030. The edge ring 1064 is formed from a material, such as silicon carbide or the like, capable of withstanding the elevated temperatures associated with thermal processing. Although not shown, lift pins extend through a bottom 1017 of the chamber 1100 to lift the substrate 112 off of the edge ring 1064 during transfer of the substrate 112 into and out of the chamber 1100. During processing, the lift pins are retracted below the edge ring 1064 out of contact with the substrate 112.

A magnetic levitation system 105 is also provided. The magnetic levitation system 105 is configured to rotate the support ring 1030, edge ring 1064, and substrate 112 during processing. For example, the magnetic levitation system 105 raises the support ring 1030 and edge ring 1064, which is supporting the substrate 112, within the processing volume 118 and causes the raised components to rotate around a central axis 134. In certain embodiments, the support ring 1030 may be disposed radially outside the window 120.

One or more pyrometers 1040 are coupled to the chamber 1100 through the chamber bottom 1017. One or more radiation collecting apparatuses 1042, such as light pipes, extend through the chamber bottom 1017 and are directed toward the substrate 112 to measure a temperature of the substrate 112. The radiation collecting apparatuses 1042 are coupled to the pyrometers 1040, which are further coupled to a controller 1044. The controller 1044 receives outputs of the pyrometers 1040 and accordingly controls the voltages supplied to the heating apparatus 124. The pyrometers 1040 generally measure light intensity in a narrow wavelength bandwidth of about 30 or 40 nm in a range between about 700 nm to about 1000 nm. The controller 1044 converts the light intensity to a temperature through the Plank distribution of the spectral distribution of light intensity radiating from a black body held at that temperature. In this manner, temperature of the substrate 112 can be monitored during thermal processing.

Figure 11:
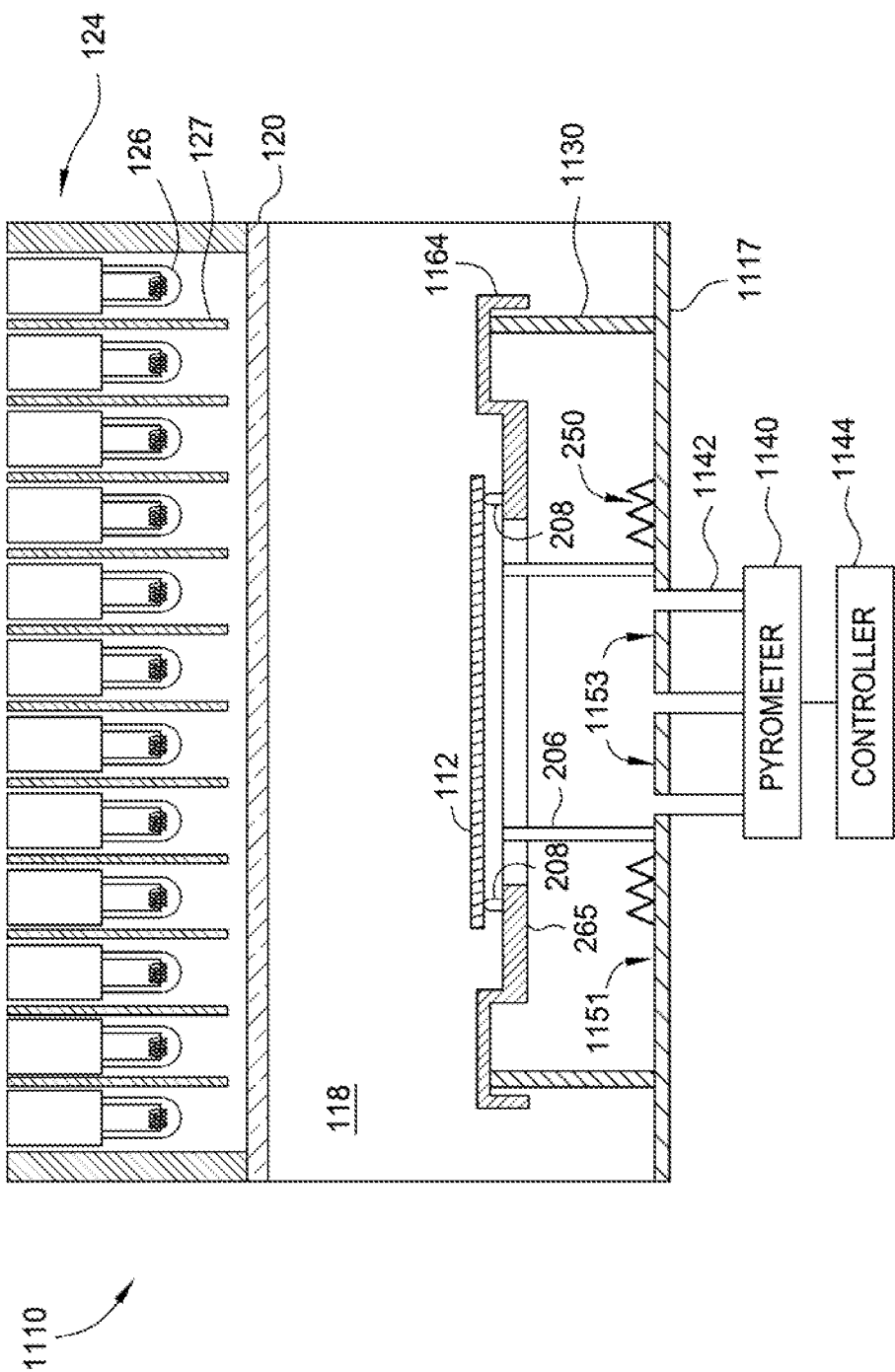
FIG. 11 illustrates a schematic, cross-sectional view of a thermal processing chamber having an edge ring and absorbing surface disposed therein.

FIG. 11 is a schematic cross-sectional view of the thermal processing chamber 1110 having the edge ring 1164 and absorbing surface 250 disposed therein according to one embodiment. The edge ring 1164 rests on the support ring 1130 as described above and the edge ring 1164 is configured to support the substrate 112. The plurality of protrusions 208 extend from the portion 1165 of the edge ring 1164 which is disposed below the substrate 112. For example, three or four protrusions 208, such as pins or posts, contact and support the substrate 112 at discrete locations on a bottom surface of the substrate 112. It is believed that the minimal physical contact between the substrate 112 and the protrusions 208 reduce thermal discontinuity across the surface of the substrate 112 when compared to traditional edge rings which support the substrate 112 around the entire circumference of the substrate 112. The protrusions 208 substantially prevent the edge ring 1164 from acting as a heat sink, which negatively affects temperature uniformity of the substrate 112 during thermal processing.

The edge ring 1164 is made from a material which is substantially opaque and thus prevents the transmission of light through the edge ring 1164. However, because the protrusions 208 separate the substrate 112 from the edge ring 1164, light may propagate through the space between the substrate 112 and the edge ring 1164 towards the pyrometers 1140. This stray radiation, or background radiation, adversely affects the temperature measurement of the pyrometers which are configured to measure the temperature of the substrate 112.

A plurality of lift pins 206 are provided in the chamber 1110. The lift pins 206 are configured to engage the substrate 112 and support the substrate 112 during processing. The lift pins 206 are also configured to raise and lower the substrate 112 to accommodate ingress and egress of the substrate 112 from a processing position. In operation, the plurality of lift pins 206 are positioned in a raised orientation to accept the substrate 112 from a robot blade (not shown). After the substrate 112 has been engaged by the lift pins 206, the robot blade is removed from the chamber 110 and the lift pins 206 retract and lower the substrate 112 into a processing position in contact with the protrusions 208. The lift pins 206 retract further to a position out of contact with the substrate 112 to enable the support 1130 and edge ring 1164 to be rotated by the magnetic levitation system (not shown).

The bottom 1117 of the chamber 1110 has the absorbing surface 250 disposed thereon. The absorbing surface 250 is configured to absorb background radiation and prevent or reduce stray background radiation from reaching the pyrometers 1140. The absorbing surface 250 may be a dielectric coating comprising various materials configured to absorb radiation within a desired wavelength. In one embodiment, the absorbing surface 250 is textured or embossed. In addition to absorbing stray background radiation, the topography of the absorbing surface 250 is configured to direct background radiation away from the pyrometers 1140. For example, a feature formed by roughening or embossing the absorbing surface 250 may reflect stray background radiation not absorbed radially outward toward the support ring 1130 away from the pyrometers 1140.

An interior surface 1151 of the bottom 1117, disposed radially outward of the pyrometers 1140 and radiation collecting apparatuses 1142, may be coated with the absorbing surface 250. However, portions 1153 of the chamber bottom 1117 between the locations where the radiation collecting apparatuses 1142 extend through the chamber bottom 1117 are not coated with the absorbing surface 250 to prevent measurement errors of the substrate 112 temperature by the pyrometers 1140. The absorbing surface 250 may be disposed over the entire interior surface 1151 radially outside the portions 1153 or may be disposed only on a portion of the interior surface 1151. For example, the absorbing surface 250 may be disposed on the interior surface 1151 at locations where the majority of stray background radiation contacts the bottom 1117.

It is believed that utilizing the absorbing surface 250 may substantially reduce or eliminate stray background radiation from reaching the pyrometers 1140. As a result, the temperature measurement of the substrate 112 by the pyrometers 1140 may be increased and a more accurate temperature measurement may be achieved.

Embodiments described herein utilize a radiation shield and absorbing surface, either alone or in combination to reduce the negative effects of stray background radiation on pyrometer temperature measurement. Methods of supporting the substrate to reduce heat discontinuity across the surface of the substrate are utilized in concert with the radiation shield and absorbing surface. As a result, accuracy of substrate temperature measurement by the pyrometers can be improved by removing the interfering background radiation. Embodiments described herein may be utilized on chambers which incorporate heating apparatuses either above or below the substrate. For example, embodiments described herein may be especially useful in the RADIANCE® and VULCAN processing chambers available from Applied Materials, Inc., Santa Clara, Calif. However, it is contemplated that the embodiments described herein may also advantageously be incorporated on processing chambers from other manufacturers.

While the foregoing is directed to embodiments of the present disclosure, other and further embodiments of the disclosure may be devised without departing from the basic scope thereof, and the scope thereof is determined by the claims that follow.

The invention claimed is:

1. An apparatus for processing a substrate, comprising:
   a chamber having a window and a ceiling at least partially defining a process volume;
   a radiation source disposed adjacent to the window;
   one or more pyrometers coupled to the ceiling opposite the radiation source;
   a support ring disposed within the processing volume;
   an edge ring having a substrate support portion, the edge ring coupled to the support ring; and
   a radiation shield removably coupled to the edge ring, wherein an inner diameter of the radiation shield extends radially inward over the substrate support portion of the edge ring and above a top most surface of the edge ring, and wherein the inner diameter of the radiation shield is less than an inner diameter of the substrate support portion of the edge ring.

2. The apparatus of claim 1, further comprising:
   an absorbing surface disposed on the ceiling adjacent to a region where the one or more pyrometers are coupled to the ceiling.

3. The apparatus of claim 1, wherein the window separates the process volume from the radiation source.

4. The apparatus of claim 3, wherein window is a quartz material.

5. The apparatus of claim 1, wherein the edge ring and the radiation shield comprise a ceramic material.

6. The apparatus of claim 1, wherein the edge ring further comprises:
   a plurality of discrete protrusions extending from an upper surface of the substrate support portion of the edge ring.

7. The apparatus of claim 1, wherein the edge ring further comprises:
   a plurality of voids formed therein and sized to allow passage of lift pins therethrough.

8. The apparatus of claim 2, wherein the one or more pyrometers are coupled to the ceiling via one or more radiation collecting apparatuses.

9. The apparatus of claim 2, wherein the absorbing surface is a dielectric material.

10. The apparatus of claim 2, wherein the absorbing surface is textured.

11. The apparatus of claim 8, wherein the radiation collecting apparatuses are coupled to a central region of the ceiling.

12. The apparatus of claim 1, wherein the radiation shield further comprises:
   a plurality of supports extending therefrom.

13. The apparatus of claim 12, wherein the plurality of supports are coupled to a bottom surface of the radiation shield, the supports comprising a first member, a second member, and a support member.

14. The apparatus of claim 13, wherein the first member extends vertically from the radiation shield, the second member extends horizontally from the first member, and the support member extends vertically from the second member.

15. An apparatus for processing a substrate, comprising:
   a chamber having a window and a ceiling at least partially defining a process volume;
   a radiation source disposed adjacent to the window;
   one or more pyrometers coupled to the ceiling opposite the radiation source;
   a support ring disposed within the processing volume;
   an edge ring having a substrate support portion, the edge ring coupled to the support ring;
   a plurality of lift pins moveably disposed in the process volume radially outward from the support ring; and
   a radiation shield coupled to the plurality of lift pins, wherein an inner diameter of the radiation shield extends radially inward over the substrate support portion of the edge ring and above a top most surface of the edge ring, and wherein the inner diameter of the radiation shield is less than an inner diameter of the substrate support portion of the edge ring.

16. The apparatus of claim 15, further comprising:
   an absorbing surface disposed on the ceiling adjacent to a region where the one or more pyrometers are coupled to the ceiling.

17. The apparatus of claim 16, wherein the absorbing surface has a topology which directs radiation away from the one or more pyrometers.

18. The apparatus of claim 17, wherein the absorbing surface is a dielectric material having a textured surface.

19. An apparatus for processing a substrate, comprising:
   a chamber having a window and a ceiling at least partially defining a process volume;
   a radiation source disposed adjacent to the window;
   one or more pyrometers coupled to the ceiling opposite the radiation source;
   a support ring disposed within the processing volume;
   an edge ring coupled to the support ring;
   a plurality of lift pins moveably disposed in the process volume radially inward from the support ring and the edge ring;
   a radiation shield removably coupled to the plurality of lift pins and the edge ring; and
   a plurality of supports extending from a bottom surface of the radiation shield, wherein the plurality of lift pins are positioned to contact the radiation shield between the edge ring and the plurality of supports.

20. The apparatus of claim 19, further comprising:
   a dielectric material absorbing surface, having a topology which directs radiation away from the one or more pyrometers, disposed on the ceiling adjacent to a region where the one or more pyrometers are coupled to the ceiling.

* * * * *